(12) United States Patent
Rieh et al.

(10) Patent No.: US 10,566,929 B2
(45) Date of Patent: Feb. 18, 2020

(54) TRIPLE-PUSH TYPE VOLTAGE-CONTROLLED OSCILLATOR

(71) Applicant: Korea University Research and Business Foundation, Seoul (KR)

(72) Inventors: JaeSung Rieh, Seoul (KR); Heekang Son, Seoul (KR); Kiryong Song, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 134 days.

(21) Appl. No.: 15/830,435

(22) Filed: Dec. 4, 2017

(65) Prior Publication Data

US 2018/0167031 A1 Jun. 14, 2018

(30) Foreign Application Priority Data

Dec. 9, 2016 (KR) .................. 10-2016-0167625
Nov. 10, 2017 (KR) .................. 10-2017-0149250

(51) Int. Cl.
*H03B 5/12* (2006.01)
*H03B 27/00* (2006.01)

(52) U.S. Cl.
CPC .......... *H03B 5/1203* (2013.01); *H03B 5/1221* (2013.01); *H03B 5/1231* (2013.01); *H03B 27/00* (2013.01)

(58) Field of Classification Search
CPC .. H03B 5/1203; H03B 5/1221; H03B 5/1231; H03B 27/00
See application file for complete search history.

(56) References Cited

U.S. PATENT DOCUMENTS

| 6,310,522 B1 * | 10/2001 | Wang .................. H03B 21/00 331/117 R |
| 2010/0253440 A1 * | 10/2010 | Li .................... H03K 3/0315 331/57 |

OTHER PUBLICATIONS

Selva Via et al., "Mode control in triple-push oscillator architectures", 2008 Workshop on Integrated Nonlinear Microwave and Milimetre-Wave Circuits, Nov. 2008.
Hooman Rashtian et al., "A 200-GHz triple-push oscillator in 65-nm CMOS with design techniques for enhancing DC-to-RF efficiency", 2016 IEEE 16th Topical Meeting on Silicon Monolithic Integrated Circuits in RF Systems (SiRF), pp. 77-80, Jan. 2016.
(Continued)

*Primary Examiner* — Jeffrey M Shin
(74) *Attorney, Agent, or Firm* — Hauptman Ham, LLP (57) ABSTRACT

A voltage-controlled oscillator having a triple-push structure is disclosed. The voltage-controlled oscillator having a triple-push structure may include: a voltage-controlled oscillation part including a multiple number of oscillation circuits configured to output an output signal based on a control voltage, where the multiple oscillation circuits are connected in a triple-push structure; a multiple number of phase shifters connected respectively to the output ends of the oscillation circuits and configured to change a phase of the output signals outputted from the output ends of the oscillation circuits; and an output part configured to output a final output signal by adding the output signals that are outputted with changed phases from the multiple phase shifters.

4 Claims, 7 Drawing Sheets

(56) References Cited

OTHER PUBLICATIONS

Sanghoon Sim et al., "A Compact X-Band Bi-Directional Phased-Array T/R Chipset in 0.13 um CMOS Technology", IEEE Transactions on Microwave Theory and Techniques, vol. 61, No. 1, pp. 562-569, Jan. 2013.
Korean Notice of Allowance dated Apr. 9, 2019 for corresponding Korean Application No. 10-2017-0149250.
Korean Office Action dated Nov. 8, 2018 for corresponding Korean Application No. 10-2017-0149250.

* cited by examiner

TRIPLE-PUSH TYPE VOLTAGE-CONTROLLED OSCILLATOR

CROSS-REFERENCE TO RELATED APPLICATIONS

This application claims the benefit of Korea Patent Application No. 10-2016-0167625, filed with the Korean Intellectual Property Office on Dec. 9, 2016, and Korean Patent Application No. 10-2017-0149250, filed with the Korean Intellectual Property Office on Nov. 10, 2017, the disclosure of which is incorporated herein by reference in its entirety.

BACKGROUND

1. Technical Field

The present invention relates to a triple-push type voltage-controlled oscillator that can operate in frequencies of several bands.

2. Description of the Related Art

In the field of electronic circuits, research on ultrahigh frequency bands, such as in the order of millimeters or terahertz, etc., is being conducted for broadband communication systems, imaging systems that use frequency characteristics, and the like. Higher frequencies mean shorter wavelengths, which provide a major advantage in that the size of the overall circuit can be reduced.

However, as the frequency band approaches the terahertz domain, the design of circuits may face difficulties due to limitations in the transistor element. Methods for overcoming this difficulty include use of the N-push technique, which utilizes harmonic wave components, and use of the frequency multiplier.

In the case of a conventional voltage-controlled oscillator, the oscillating frequency may be determined by the voltage, with a tolerance range of generally about 10% of the frequency. As such, one oscillator cannot be used to handle various bands, and a design including two or more oscillators may be needed.

SUMMARY OF THE INVENTION

An aspect of the invention is to provide a triple-push voltage-controlled oscillator that can operate in frequencies of several bands.

An embodiment of the invention provides a voltage-controlled oscillator that includes: a voltage-controlled oscillation part including a multiple number of oscillation circuits configured to output an output signal based on a control voltage, where the multiple oscillation circuits are connected in a triple-push structure; a multiple number of phase shifters connected respectively to the output ends of the oscillation circuits and configured to change a phase of the output signals outputted from the output ends of the oscillation circuits; and an output part configured to output a final output signal by adding the output signals that are outputted with changed phases from the multiple phase shifters.

The multiple phase shifters can selectively change the phases of the output signals outputted from the output ends of the respective oscillation circuits in correspondence to the final output signal selectively outputted by the output part.

The output signal may be one of a basic signal ($f_0$), a second harmonic signal ($2f_0$), and a third harmonic signal.

Each of the multiple oscillation circuits can include one transistor and one capacitor. A collector electrode of each transistor included in each oscillation circuit can be connected with any one of the multiple phase shifters by way of a contact and can be connected with a base electrode of a transistor included in any one of the other oscillation circuits. An emitter electrode of a transistor included in each of the oscillation circuits can be connected with the ground.

A triple-push type voltage-controlled oscillator according to an embodiment of the invention can enable operation for a basic mode, a second harmonic mode, and a third harmonic mode with a single voltage-controlled oscillator.

Additional aspects and advantages of the present invention will be set forth in part in the description which follows, and in part will be obvious from the description, or may be learned by practice of the invention.

DETAILED DESCRIPTION OF THE INVENTION

In the present specification, an expression used in the singular encompasses the expression of the plural, unless it has a clearly different meaning in the context. In the present specification, terms such as "comprising" or "including," etc., should not be interpreted as meaning that all of the elements or steps are necessarily included. That is, some of the elements or steps may not be included, while other additional elements or steps may be further included. Also, terms such as "part", "module", etc., used in the present specification refer to a unit that processes at least one function or operation, where such a unit can be implemented as hardware or software or as a combination of hardware and software.

Certain embodiments of the invention are described below in more detail with reference to the accompanying drawings.

Figure 1A:
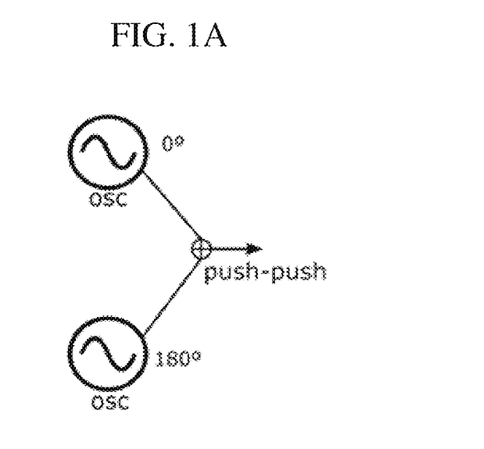
FIG. 1A, FIG. 1B, and FIG. 1C schematically illustrate the composition of a voltage-controlled oscillator having an n-push structure according to an embodiment of the invention.
Figure 1B:
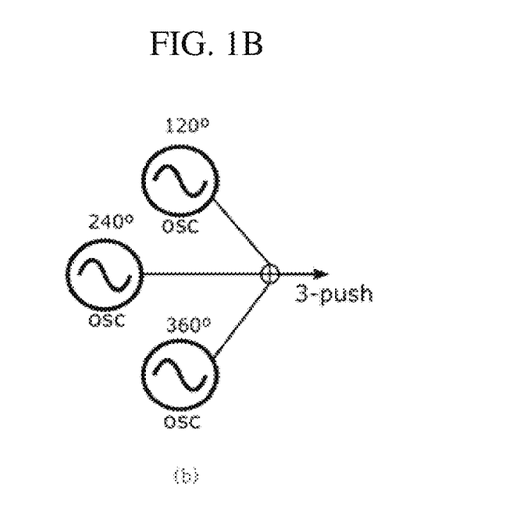
Figure 1C:
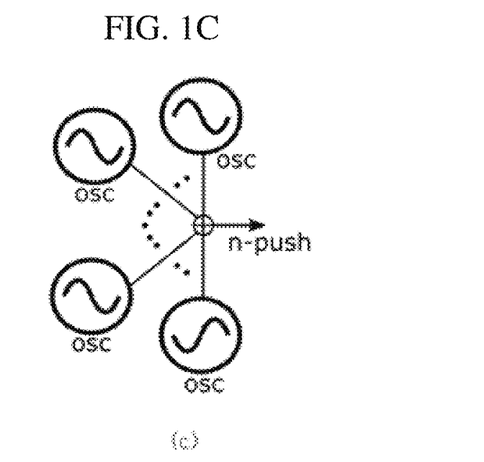

FIGS. 1A to 1C schematically illustrate the composition of a voltage-controlled oscillator having an n-push structure according to an embodiment of the invention.

FIG. 1A relates to a voltage-controlled oscillator having a dual-push structure. With the structure shown in FIG. 1A, the $f_0$ signals outputted respectively from the voltage-controlled oscillators have a phase difference of 180 degrees and are thus cancelled out. In contrast, the $2f_0$ signals corresponding to second harmonic signals outputted from the voltage-controlled oscillators have no phase difference, and thus a stronger signal may be outputted.

FIG. 1B shows a voltage-controlled oscillator having a triple-push structure, where the phases of the $f_0$ signals outputted respectively from the voltage-controlled oscillators are 120 degrees, 240 degrees, and 360 degrees, so that the signals are cancelled out by a vector sum. With this triple-push structure, the $3f_0$ signals outputted from the voltage-controlled oscillators have no phase difference, so that the strongest $3f_0$ signal may be outputted.

FIG. 1C illustrates a voltage-controlled oscillator having an n-push structure. While it is possible to design a voltage-controlled oscillator to have an n-push structure as illustrated in FIG. 1C, it is not generally used, because the output signals are weak for fourth and higher harmonic signals.

In this manner, a voltage-controlled oscillator having an N-push structure may be designed to output a single output signal according to the intended purpose.

However, an embodiment of the invention provides a voltage-controlled oscillator 200 having an N-push structure that can operate in multiple bands, as described below in further detail.

Figure 2:
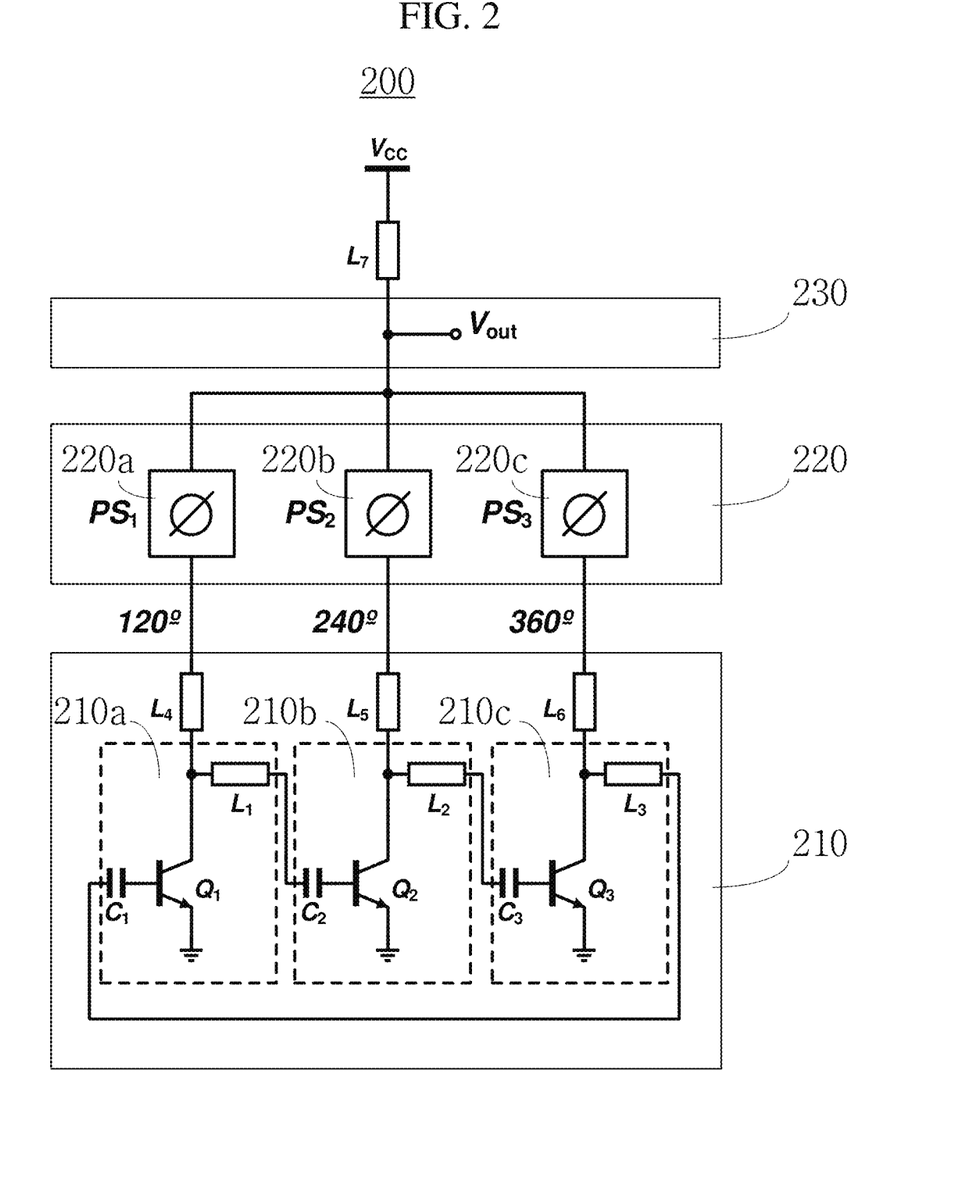
FIG. 2 illustrates the structure of a voltage-controlled oscillator having a triple-push structure according to an embodiment of the invention.

FIG. 2 illustrates the structure of a voltage-controlled oscillator having a triple-push structure according to an embodiment of the invention, while FIGS. 3 to 6 are graphs for describing output signals in relation to operating bands in an embodiment of the invention.

Referring to FIG. 2, a voltage-controlled oscillator 200 according to an embodiment of the invention may include a voltage-controlled oscillation part 210, phase shifters 220, and an output part 230.

The voltage-controlled oscillation part 210 may include a multiple number of oscillation circuits 210a to 210c. The multiple oscillation circuits 210a to 210c may be connected to form an N-push structure as shown in FIG. 1C.

As the descriptions here focus mainly on an example in which the voltage-controlled oscillation part 210 has a triple-push structure, the figure illustrates three oscillation circuits connected in parallel, but other examples can have two or four oscillation circuits connected to form an N-push structure.

A voltage-controlled oscillation part 210 having a triple-push structure according to an embodiment of the invention may include a first oscillation circuit 210a, a second oscillation circuit 210b, and a third oscillation circuit 210c.

The first, second, and third oscillation circuits 210a, 210b, 210c may be connected in parallel, with the collector electrode of the transistor included in each oscillation circuit connected via a contact to the base electrode of the transistor included in one of the other oscillation circuits. A more detailed description is provided below.

The first oscillation circuit 210a may include a first transistor $Q_1$ and a first capacitor $C_1$. In this specification, it is assumed that a transistor element is a BJT, but the same can be applied to other transistor elements such as a MOSFET.

The base electrode of the first transistor $Q_1$ may be connected by way of the first capacitor $C_1$ with the output end of the third oscillation circuit 210c. That is, the base electrode of the first transistor $Q_1$ may be connected to one end of the first capacitor $C_1$. The first capacitor $C_1$ may have one end connected with the base electrode of the first transistor $Q_1$ and have the other end connected with the output end of the third oscillation circuit 210c (i.e. the collector electrode of the third transistor included in the third oscillation circuit 210c). The emitter electrode of the first transistor $Q_1$ may be connected with the ground.

The collector electrode of the first transistor $Q_1$ may branch out into a first transmission line and a fourth transmission line by way of a first contact. Thus, the collector electrode of the first transistor $Q_1$ may branch out to the first transmission line $L_1$ at the first contact and may connect with the second oscillation circuit 210b by way of the first transmission line $L_1$. In other words, one end of the first transmission line $L_1$ may connect to the capacitor included in the second oscillation circuit 210b (referred to herein as the second capacitor).

Also, the collector electrode of the first transistor $Q_1$ may be connected with the first phase shifter 220a by the fourth transmission line by way of the first contact. Because of this, the output signal outputted through the collector electrode of the first transistor $Q_1$ may pass through the first phase shifter 220a by way of the fourth transmission line.

The second oscillation circuit 210b may include a second transistor $Q_2$ and a second capacitor $C_2$.

The base electrode of the second transistor $Q_2$ may be connected by way of the second capacitor $C_2$ with the output end of the first oscillation circuit 210a. That is, the base electrode of the second transistor $Q_2$ may be connected to one end of the second capacitor $C_2$. The second capacitor $C_2$ may have one end connected with the base electrode of the second transistor $Q_2$ and have the other end connected with the output end of the first oscillation circuit 210a (i.e. the collector electrode of the first transistor included in the first oscillation circuit 210a). The emitter electrode of the second transistor $Q_2$ may be connected with the ground.

The collector electrode of the second transistor $Q_2$ may branch out into a second transmission line and a fifth transmission line by way of a second contact. Thus, the collector electrode of the second transistor $Q_2$ may branch out to the second transmission line $L_2$ at the second contact and may connect with the third oscillation circuit 210c by way of the second transmission line $L_2$. In other words, one end of the second transmission line $L_2$ may connect to the capacitor included in the third oscillation circuit 210c (referred to herein as the third capacitor).

Also, the collector electrode of the second transistor $Q_2$ may be connected with the second phase shifter 220b by the fifth transmission line by way of the second contact. Because of this, the output signal outputted through the collector electrode of the second transistor $Q_2$ may pass through the second phase shifter 220b by way of the fifth transmission line.

The third oscillation circuit 210c may include a third transistor $Q_3$ and a third capacitor $C_3$.

The base electrode of the third transistor $Q_3$ may be connected by way of the third capacitor $C_3$ with the output end of the second oscillation circuit 210b. That is, the base electrode of the third transistor $Q_3$ may be connected to one end of the third capacitor $C_3$. The third capacitor may have one end connected with the base electrode of the third transistor $Q_3$ and have the other end connected with the output end of the second oscillation circuit 210b (i.e. the collector electrode of the second transistor included in the second oscillation circuit 210b). The emitter electrode of the third transistor $Q_3$ may be connected with the ground.

The collector electrode of the third transistor $Q_3$ may branch out into a third transmission line and a sixth transmission line by way of a third contact. Thus, the collector electrode of the third transistor $Q_3$ may branch out to the third transmission line $L_3$ at the third contact and may connect with first oscillation circuit 210a by way of the third transmission line $L_3$. In other words, one end of the third transmission line $L_3$ may connect to the capacitor included in the first oscillation circuit 210a (referred to herein as the first capacitor).

Also, the collector electrode of the third transistor $Q_3$ may be connected with the third phase shifter 220c by the sixth transmission line by way of the third contact. Because of this, the output signal outputted through the collector electrode of the third transistor $Q_3$ may pass through the third phase shifter 220c by way of the sixth transmission line.

The oscillation circuits connected in a triple-push structure as in FIG. 2 may each output an output signal such that the output signals have phase differences of 120 degrees. As the descriptions here focus mainly on an example having a triple-push structure, the oscillation circuits are described as outputting output signals that have phase differences of 120 degrees, but in cases where the connection structure of the oscillation circuits is different, it is obvious that the phase difference of the output signals outputted from the oscillation circuits may vary.

The multiple number of phase shifters 220 may each be connected to the output end of a respective oscillation circuit. Thus, each phase shifter 220 can change the phase of the output signal outputted via the output end of the respective oscillation circuit 210a to 210c in correspondence to the desired final output signal.

The output part 230 may add the output signals that have passed through the phase shifters 220 to output the final output signal.

For easier understanding and easier explanation, a description is provided below on the operating procedures of the multiple phase shifters 220 corresponding to the final output signal outputted from the output part 230.

Figure 3:
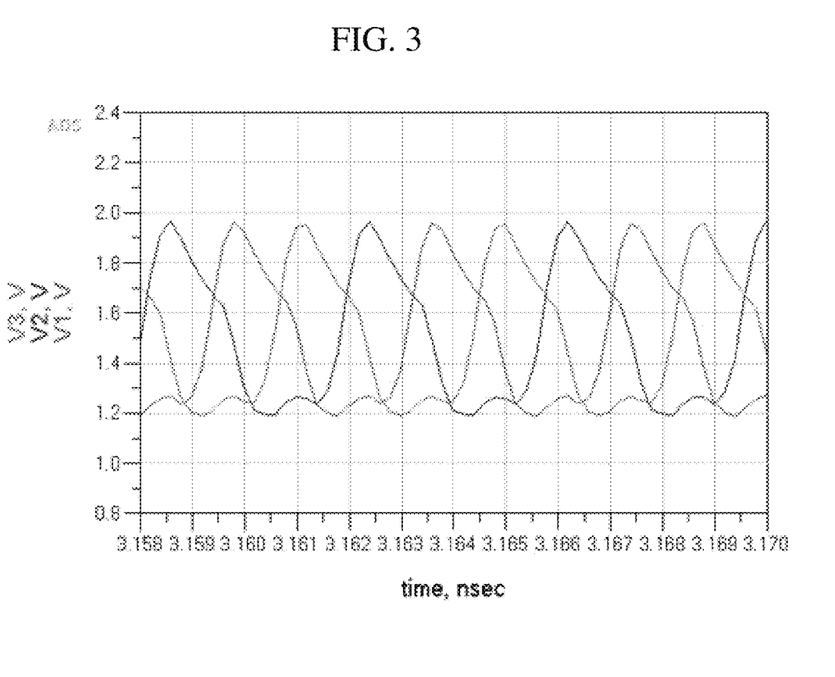
FIG. 3, FIG. 4, FIG. 5, and FIG. 6 are graphs for describing output signals in relation to operating bands in an embodiment of the invention.

FIG. 3 is a graph plotting the output signals outputted the output end of each oscillation circuit according to an embodiment of the invention. As illustrated in FIG. 3, the oscillation circuits connected in a triple-push structure can each output an output signal such that the signals have a 120-degree phase difference. Thus, the output signal outputted from the first oscillation circuit may have a phase of 120 degrees, the output signal outputted from the second oscillation circuit may have a phase of 240 degrees, and the output signal outputted from the third oscillation circuit may have a phase of 360 degrees.

If an output signal corresponding to a third harmonic signal ($3f_0$) is to be outputted from the voltage-controlled oscillator 200, each of the phase shifters 220 may change the phase of the output signals outputted from the respective oscillation circuit to 0 degrees. Thus, the output signals ($f_0$) corresponding to the basic frequency signals outputted from the respective oscillation circuits may be cancelled out at the output part 230 and may not be outputted. Consequently, the output part 230 may output the strongest $3f_0$.

Figure 4:
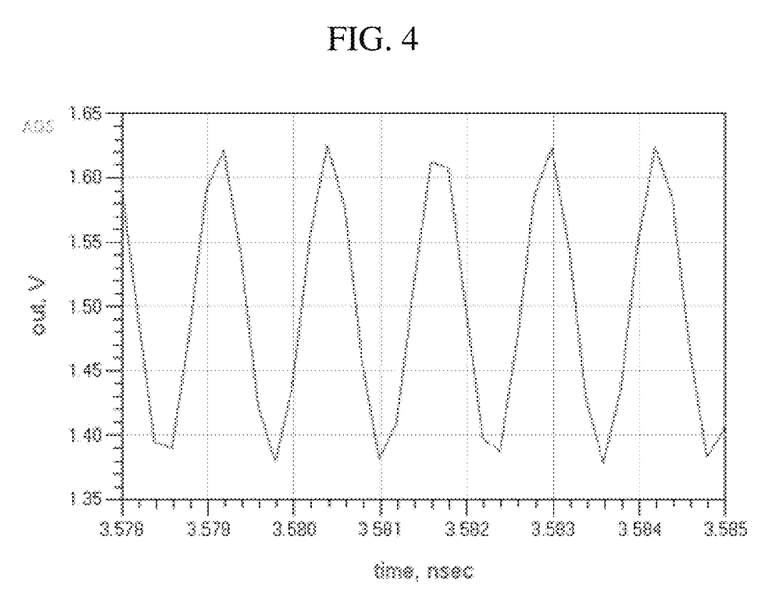
Figure 6:
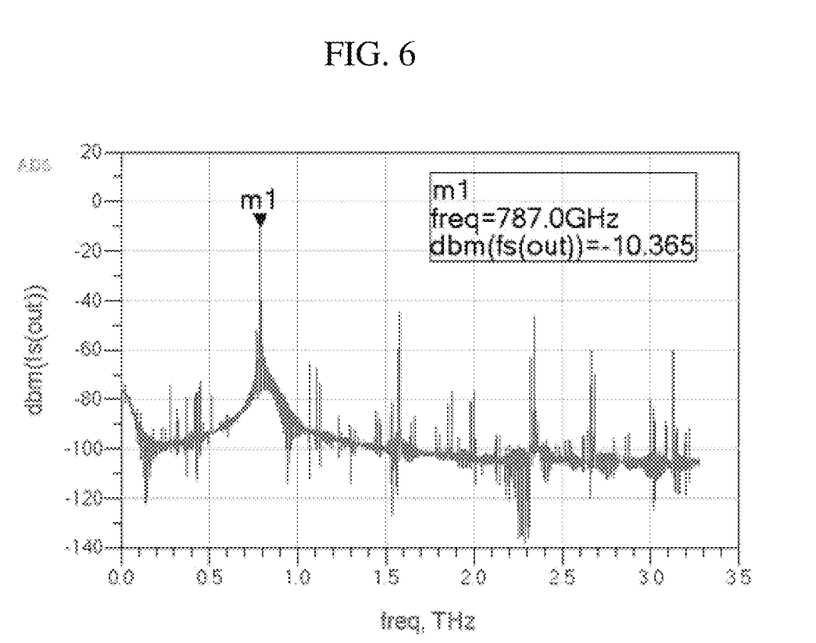

FIG. 4 represents the $3f_0$ signal outputted from each oscillation circuit, while FIG. 6 shows the results of checking the frequency of the $3f_0$ signal.

Figure 5:
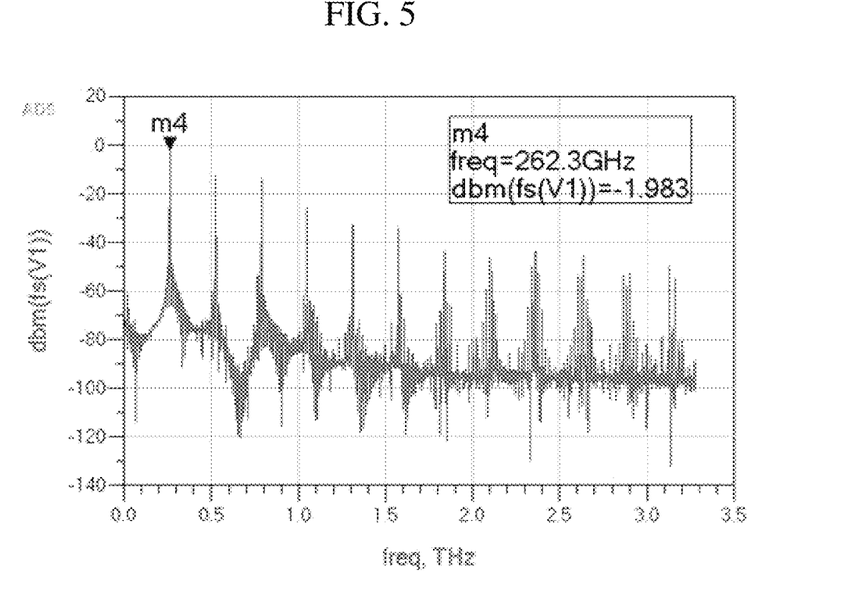

If the voltage-controlled oscillator 200 is to output $f_0$ as the final output signal, the first phase shifter 220a can change the output signal outputted from the first oscillation circuit 210a by 240 degrees. Also, the second phase shifter 220b can change the output signal outputted from the second oscillation circuit 210b by 120 degrees. The third phase shifter 220c may change the output signal outputted from the third oscillation circuit 210c by 0 degrees. Accordingly, the phases of the $f_0$ signals after passing through the respective phase shifters 220 would be 0 degrees, 0 degrees, and 0 degrees, as a result of which the output part 230 may output the strongest $f_0$ as the final output signal. FIG. 5 represents the frequency of the $f_0$ signal at the final output end.

Similarly, suppose the voltage-controlled oscillator 200 is to output $2f_0$ as the final output signal. Here, the first phase shifter 220a may change the phase of the output signal outputted from the first oscillation circuit 210a by 60 degrees. Further, the second phase shifter 220b can change the phase of the output signal outputted from the second oscillation circuit 210b by 120 degrees, and the third phase shifter 220c can change the phase of the output signal outputted from the third oscillation circuit 210c by 0 degrees.

Thus, the output signals of $f_0$ having passed through the respective phase shifters 220 would have phases of 180 degrees, 360 degrees, and 360 degrees. However, the output signals of $2f_0$ corresponding to the second harmonic signals would have phases of 0 degrees, 0 degrees, and 0 degrees, whereby the strongest $2f_0$ may be outputted as the final output signal.

Thus, with a voltage-controlled oscillator 200 having a triple-push structure according to an embodiment of the invention, it is possible to selectively output one of a basic signal ($f_0$), a second harmonic signal ($2f_0$), and a third harmonic signal ($3f_0$). This means that a single voltage-controlled oscillator can be operated in multiple bands, and in cases such as for spectroscopy, etc., where the response frequency may vary according to the material, the voltage-controlled oscillator can be used to select a signal from multiple available output signals to readily detect a target material.

The embodiments of the present invention described above are disclosed for illustrative purposes only. A person having ordinary skill in the field of art to which the present invention pertains would be able to make various modifications, alterations, and additions without departing from the spirit and scope of the invention, and it is to be appreciated that such modifications, alterations, and additions should be considered as being encompassed by the scope of claims set forth below.

What is claimed is:

1. A voltage-controlled oscillator comprising:
   a voltage-controlled oscillation part including a plurality of oscillation circuits configured to output an output signal based on a control voltage, the plurality of oscillation circuits connected in a triple-push structure;
   a plurality of phase shifters connected respectively to output ends of the oscillation circuits and configured to change a phase of output signals outputted from the output ends of the oscillation circuits; and
   an output part configured to output a final output signal by adding the output signals outputted with changed phases from the plurality of phase shifters,
   wherein the plurality of phase shifters selectively change the phases of the output signals outputted from the output ends of the respective oscillation circuits in correspondence to the final output signal selectively outputted by the output part.

2. The voltage-controlled oscillator of claim 1, wherein the output signal is one of a basic signal ($f_0$), a second harmonic signal ($2f_0$), and a third harmonic signal ($3f_0$).

3. The voltage-controlled oscillator of claim 1, wherein each of the plurality of oscillation circuits include one transistor and one capacitor,
   a collector electrode of each transistor included in each oscillation circuit is connected with any one phase shifter from among the plurality of phase shifters by way of a contact and is connected with a base electrode of a transistor included in any one of other oscillation circuits, and
   an emitter electrode of a transistor included in each of the oscillation circuits is connected with a ground.

4. A voltage-controlled oscillator having a triple-push structure, the voltage-controlled oscillator comprising:

a first phase shifter, a second phase shifter, and a third phase shifter connected to the voltage-controlled oscillator having a triple-push structure, wherein the voltage-controlled oscillator selectively outputs one of a basic signal ($f_o$), a second harmonic signal ($2f_o$), and a third harmonic signal according to a phase adjustment by the first phase shifter, the second phase shifter, and the third phase shifter.

* * * * *